(12) United States Patent
Dechant et al.

(10) Patent No.: US 11,133,810 B2
(45) Date of Patent: Sep. 28, 2021

(54) DETERMINATION OF THE SYNCHRONIZATION OF THE OUTPUT SIGNAL FROM AN INJECTION LOCKED OSCILLATOR WITH AN INJECTION SIGNAL

(71) Applicant: Infineon Technologies AG, Neubiberg (DE)

(72) Inventors: Martin Dechant, Graz (AT); Philipp Franz Freidl, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/885,862

(22) Filed: May 28, 2020

(65) Prior Publication Data
US 2020/0389174 A1    Dec. 10, 2020

(30) Foreign Application Priority Data

Jun. 7, 2019  (DE) .......................... 102019208369.2

(51) Int. Cl.
| | | |
|---|---|---|
| *H03L 7/24* | (2006.01) | |
| *H03K 5/24* | (2006.01) | |
| *H03B 19/00* | (2006.01) | |

(52) U.S. Cl.
CPC .............. *H03L 7/24* (2013.01); *H03B 19/00* (2013.01); *H03K 5/24* (2013.01)

(58) Field of Classification Search
CPC .................................. H03L 7/24; H03B 19/00
See application file for complete search history.

(56) References Cited

U.S. PATENT DOCUMENTS

| | | | |
|---|---|---|---|
| 4,238,796 A | 12/1980 | Mawhinney | |
| 6,369,659 B1 | 4/2002 | Delzer et al. | |
| 10,790,839 B2 * | 9/2020 | Jany | H03L 7/083 |

(Continued)

FOREIGN PATENT DOCUMENTS

| | | |
|---|---|---|
| JP | 54-132158 A | 10/1979 |
| JP | 2013005279 A | 1/2013 |
| JP | 2016201685 A | 12/2016 |

OTHER PUBLICATIONS

Shin, Dongseok, Sanjay Raman, and Kwang-Jin Koh. "2.8 a mixed-mode injection frequency-locked loop for self-calibration of injection locking range and phase noise in 0.13 μm CMOS." 2016 IEEE International Solid-State Circuits Conference (ISSCC). IEEE ,2016. (Year: 2016).*

(Continued)

*Primary Examiner* — Ryan Johnson
(74) *Attorney, Agent, or Firm* — Harrity & Harrity, LLP

(57) ABSTRACT

An apparatus for determining whether an output signal from an injection locked oscillator is synchronized with an injection signal coming from an input oscillator has a distorter and a level detector. The distorter uses the output signal from the injection locked oscillator to generate a distorter output signal which has a difference tone in a predetermined frequency band if the output signal from the injection locked oscillator is not synchronized with the injection signal. The level detector is designed to detect a level of the difference tone. The apparatus determines, on the basis of the level of the difference tone, whether the output signal from the injection locked oscillator is synchronized with the injection signal.

20 Claims, 4 Drawing Sheets

(56) References Cited

U.S. PATENT DOCUMENTS

2004/0036538 A1    2/2004   Devries et al.
2020/0119742 A1*   4/2020   Jain .......................... G06F 1/10

OTHER PUBLICATIONS

Yoo, Seyeon, et al. "A low-integrated-phase-noise 27-30-GHz injection-locked frequency multiplier with an ultra-low-power frequency-tracking loop for mm-wave-band 5G transceivers." IEEE Journal of Solid-State Circuits 53.2 (2017): 375-388. (Year: 2017).*

Hoffmann, "Hochfrequenztechnik," Springer-Verlag Berlin, 1997, pp. 428-429.

Stancampiano et al., "Power Spectrum of an Injection-Locked Josephson Oscillator," IEEE Transactions on Magnetics, vol. MAG-11, No. 2, Mar. 1975, pp. 800-803.

* cited by examiner

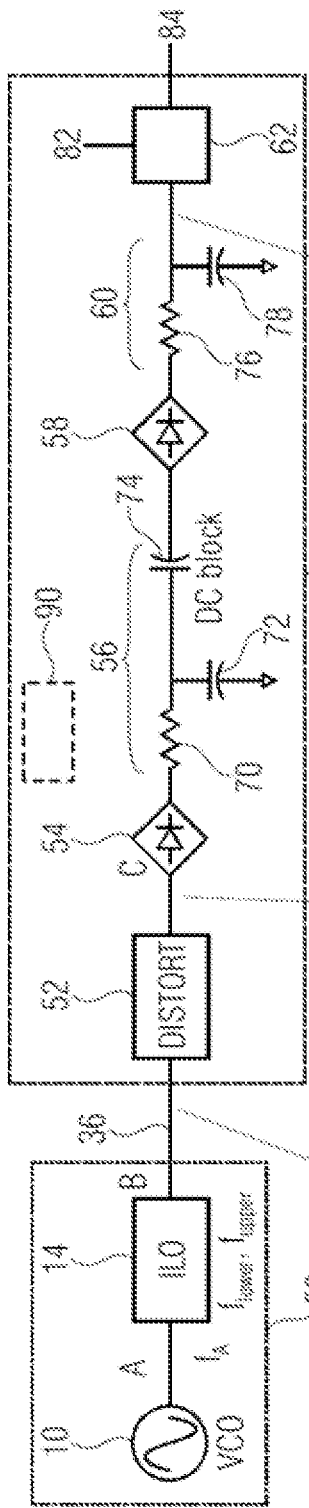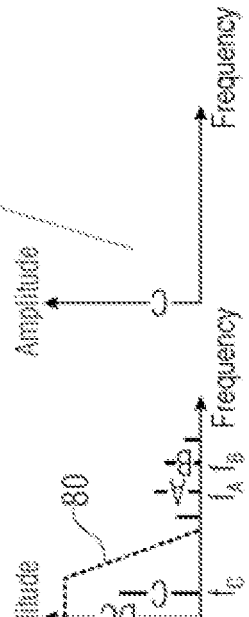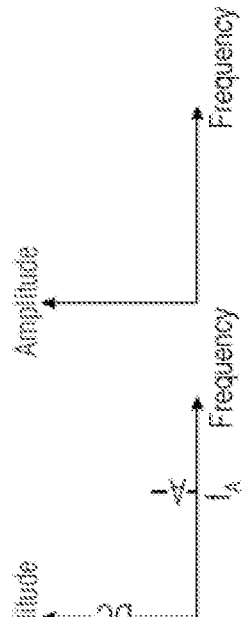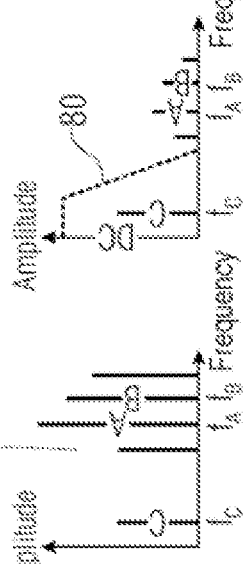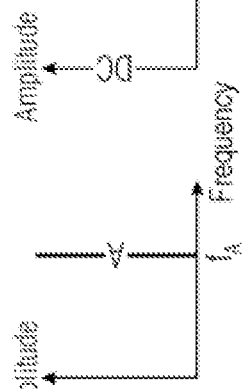

DETERMINATION OF THE SYNCHRONIZATION OF THE OUTPUT SIGNAL FROM AN INJECTION LOCKED OSCILLATOR WITH AN INJECTION SIGNAL

CROSS REFERENCE TO RELATED APPLICATION

This application claims priority to German Patent Application No. 102019208369.2 filed on Jun. 7, 2019, the content of which is incorporated by reference herein in its entirety.

TECHNICAL FIELD

The present disclosure deals with the determination of whether an output signal from an injection locked oscillator is synchronized with an injection signal.

BACKGROUND

Injection locked oscillators (ILOs) can be used in various electronic circuits, for example frequency multipliers, frequency dividers and amplifiers. The ILO receives an injection signal from an upstream oscillator, for example a voltage-controlled oscillator (VCO). If the free-running resonant frequency of the ILO is in a synchronization bandwidth with respect to the frequency of the injection signal, the ILO locks to the frequency of the injection signal. In other words, the output signal from the ILO is then synchronized with the injection signal.

There are also frequency-multiplying ILOs in which a frequency of the output signal from the ILO corresponds to an integer multiple of the frequency of the upstream oscillator. FIG. 7 shows an example of a frequency-multiplying ILO 14 which has a harmonic generator 12 and an oscillator 13. An output of a VCO 10 is coupled to the harmonic generator 12. The output signal from the harmonic generator is used as an injection signal for the oscillator 13. In other frequency-multiplying ILOs, a separate harmonic generator is not provided, but rather harmonics can be generated by overdriving transistors, for example a transistor pair used as an injector. The oscillator 13 may be formed, for example, by a cross-coupled LC oscillator or a ring oscillator. The output signal from the VCO 10 has a frequency $f_0$ which is an input frequency for the ILO 14, and the output signal from the harmonic generator 12 has, inter alia, a frequency $N \cdot f_0$. The output signal from the ILO 14 likewise has the frequency $N \cdot f_0$ if the ILO is synchronized with the injection signal. If the free-running resonant frequency of the frequency-multiplying ILO is within a synchronization bandwidth with respect to the frequency of the injection signal multiplied by the multiplier N, the ILO locks to this frequency. Environmental changes, for example temperature fluctuations and/or load changes can result in unwanted fluctuations of the free-running resonant frequency of the ILO.

In order to determine whether or not the ILO is synchronized with the injection signal, the power/voltage level of the output signal from the ILO could be captured, but this measure is ambiguous since the non-synchronized state generates a tone at the free-running resonant frequency of the ILO with a rather high level. This tone is usually so close to the frequency of the intended signal, that is to say the frequency of the injection signal, that conventional level detectors cannot distinguish the two frequencies. Therefore, instead of the level of the intended signal, both signals are measured, both at the intended frequency and at the free-running resonant frequency, which is a not very sensitive indication.

Another method could involve measuring the level at the synchronized frequency only with the aid of an IQ mixer which mixes the ILO input signal with the ILO output signal to the baseband. Even for frequency-multiplying ILOs, for example ×3 or ×5 ILOs, the mixer switches will generate sufficient harmonics in order to mix the third or fifth harmonic (minus the locked ILO output signal) to a baseband frequency, for example a DC (direct current) frequency. This makes it possible to measure only the strength of the output signal at the intended frequency, with the exception of mixer offset errors. Maximizing this tone is a method for finding the synchronization point (locking point). However, such a method is based on an expensive and complicated IQ mixer.

Another possibility would involve carrying out a fast Fourier transform (FFT). However, this would require an additional local oscillator (LO) at the frequency of interest plus a bandwidth above the synchronization bandwidth. These two requirements make such a method unsuitable for on-chip solutions which use installed ADWs (analog/digital converters) and FFT algorithms.

OVERVIEW

Examples of the present disclosure provide an apparatus for determining whether an output signal from an injection locked oscillator is synchronized with an injection signal coming from an input oscillator, having the following features: a distorter which is designed to use the output signal from the injection locked oscillator to generate a distorter output signal which has a difference tone in a predetermined frequency band if the output signal from the injection locked oscillator is not synchronized with the injection signal; and a level detector which is designed to detect a level of the difference tone, wherein the apparatus is designed to determine, on the basis of the level of the difference tone, whether the output signal from the injection locked oscillator is synchronized with the injection signal.

Examples of the present disclosure provide a method for determining whether an output signal from an injection locked oscillator is synchronized with an injection signal coming from an input oscillator, having the following features of: distorting the output signal from the injection locked oscillator in order to generate a distorted signal which has a difference tone in a predetermined frequency band if the output signal from the injection locked oscillator is not synchronized with the injection signal; detecting the level of the difference tone; and determining whether the output signal from the injection locked oscillator is synchronized with the injection signal on the basis of the level of the difference tone.

Examples of the present disclosure use the fact that, in the non-synchronized state, two tones are present in the output signal from the injection locked oscillator (ILO), specifically at the input frequency and at the free-running frequency of the ILO. If the ILO is a frequency-multiplying ILO, two tones are present in the non-synchronized state, specifically the correctly multiplied input frequency and the free-running frequency of the ILO. The two tones are arranged sufficiently close to one another to generate a difference tone in a much lower frequency band if they are passed through the distorter. This difference tone is in a predetermined frequency band which comprises expected spacings between the input frequency or the correctly multiplied input frequency and the free-running frequency of the ILO. This difference tone can be captured using a level detector in order to determine, on the basis of the level of the difference tone, whether the output signal from the ILO is synchronized with the injection signal. Circuit structures which make this possible can be readily implemented on-chip in an integrated circuit.

BRIEF DESCRIPTION OF THE DRAWINGS

Examples of the disclosure are described below with reference to the accompanying drawings, in which:

FIG. 3 shows a schematic illustration of an apparatus having two level detectors according to one example of the present disclosure;

FIGS. 4A to 4D show spectra showing tones which occur in the apparatus from FIG. 3 in the non-synchronized state;

FIGS. 5A to 5D show spectra showing tones which occur in the apparatus from FIG. 3 in the synchronized state;

DETAILED DESCRIPTION

Examples of the present disclosure are described in detail below using the accompanying drawings. It should be pointed out that identical elements or elements which have the same functionality can be provided with identical or similar reference signs, in which case a repeated description of elements which are provided with the same or similar reference sign is typically omitted. Descriptions of elements which have identical or similar reference signs are mutually interchangeable. Many details are described in the following description in order to provide a more in-depth explanation of examples of the disclosure. However, it is obvious to experts that other examples can be implemented without these specific details. Features of the different examples described can be combined with one another unless features of a corresponding combination are mutually exclusive or such a combination is expressly excluded.

Figure 8:
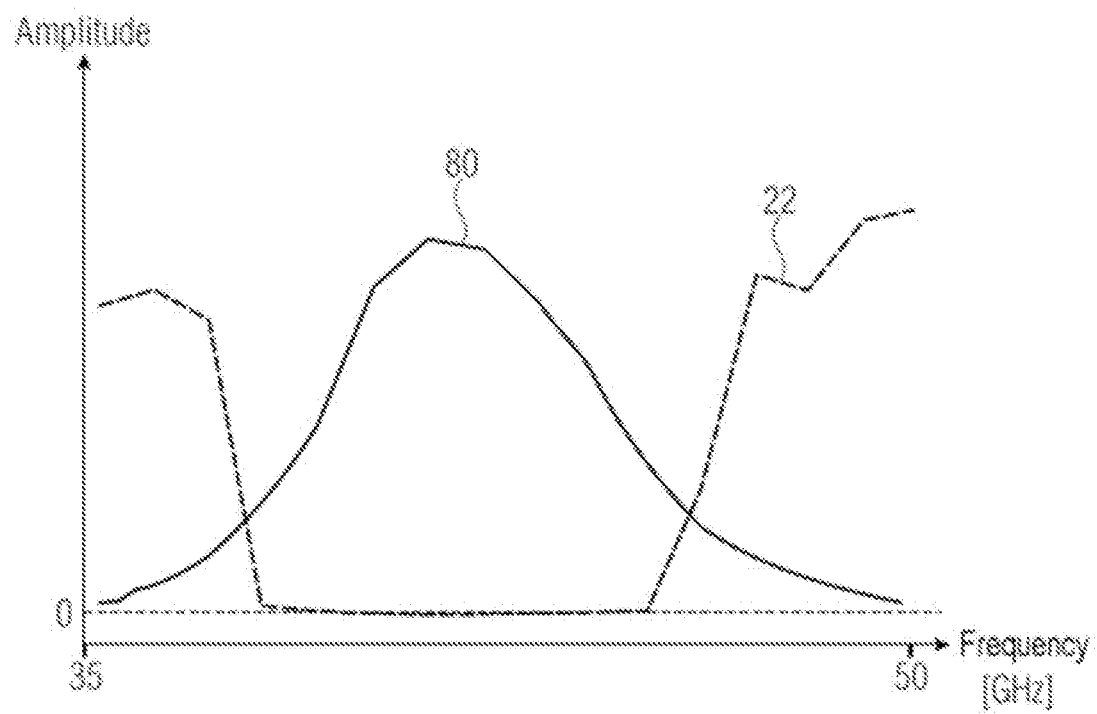
FIG. 8 schematically shows spectral lines showing the free-running tone of the ILO and the tone at the intended synchronization frequency in the synchronized state.

Examples of the present disclosure are based on the knowledge that the output signal from the ILO exhibits two tones at comparable levels in the non-synchronized state, wherein the first tone is at the frequency of the injection signal or of the correctly multiplied injection signal and the second tone is at the free-running resonant frequency, natural oscillation frequency, of the ILO. FIG. 8 shows a possible behavior of an ILO. A spectral line 20 shows a tone at the intended synchronization frequency. A spectral line 22 shows the free-running ILO tone if the ILO is synchronized with the injection signal. The section in which the spectral line 22 has an amplitude, that is to say level, close to zero, or in other words the section in which the free-running tone therefore disappears, can be considered to be "synchronized" or "locked". In this region, only the intended tone at the synchronization frequency appears in the spectrum. In contrast, both tones would appear in the spectrum if the ILO were not synchronized with the injection signal. This fact is used in examples of the disclosure to determine whether or not the ILO is synchronized with the injection signal.

Figure 1:
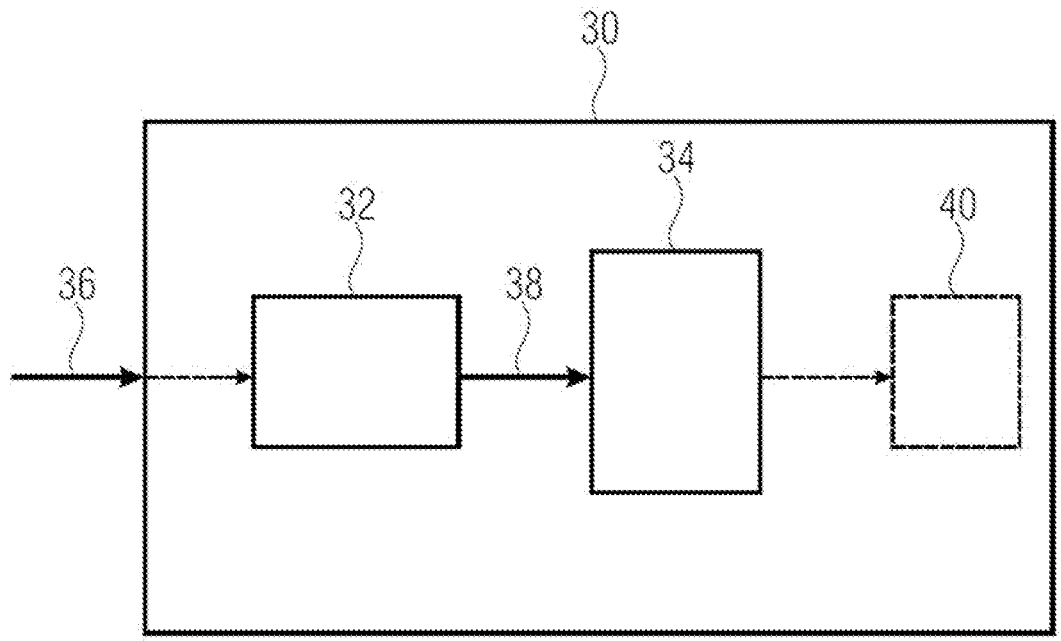
FIG. 1 shows a schematic illustration of an apparatus for determining whether an output signal from an ILO is synchronized with an injection signal according to one example of the present disclosure.
Figure 2:
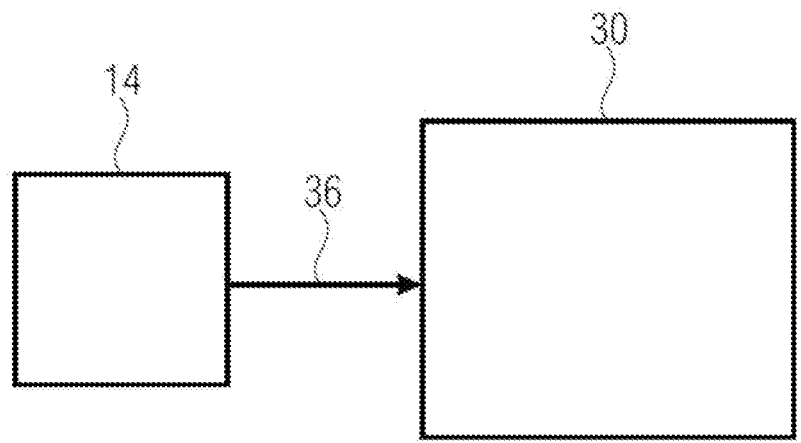
FIG. 2 shows a schematic illustration of an example of a system having an apparatus according to FIG. 1 and an input oscillator.
Figure 6:
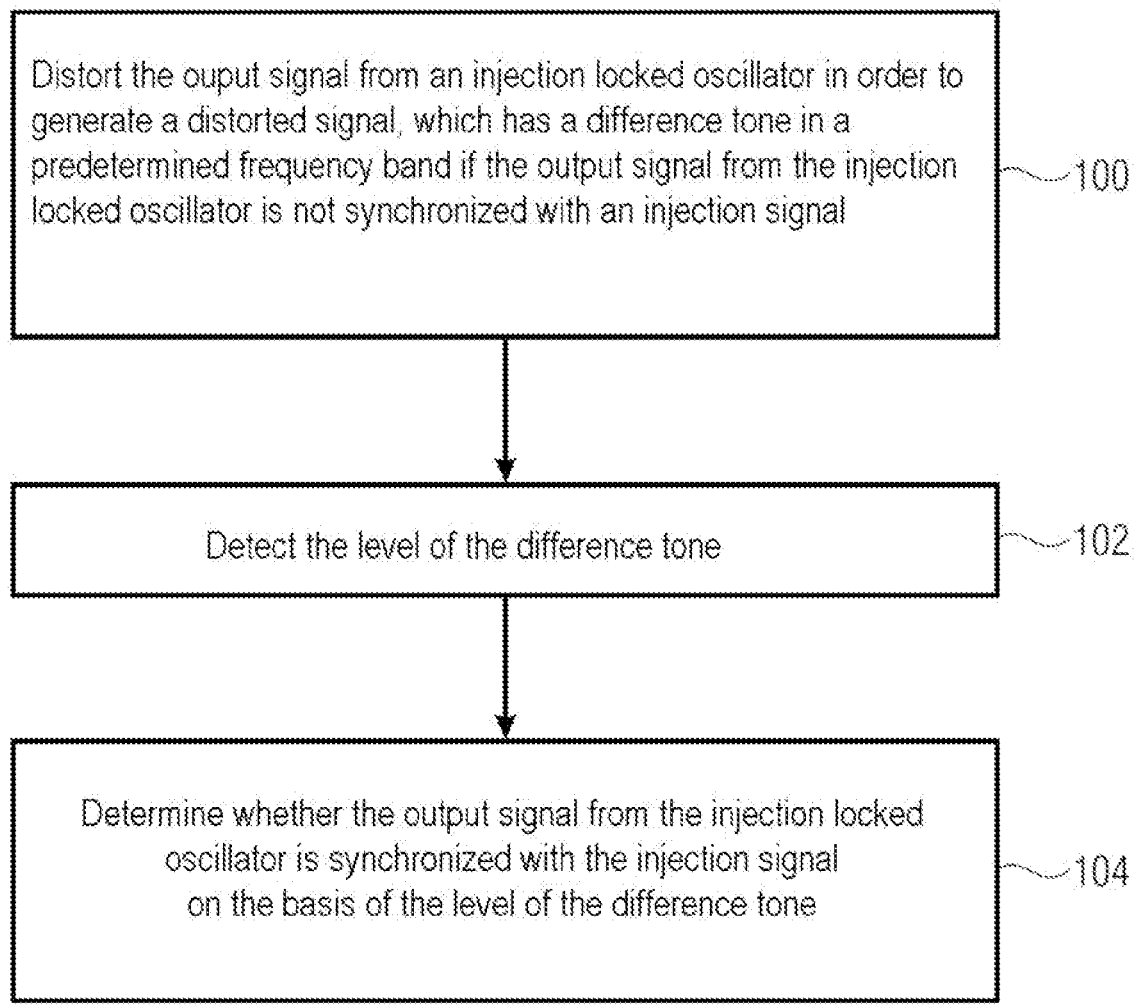
FIG. 6 shows a flowchart of a method according to one example of the present disclosure.

FIG. 1 shows an example of an apparatus 30 which has a distorter 32 and a level detector 34. The distorter 32 receives, at its input, an output signal 36 from an ILO. The distorter 32 generates a distorter output signal 38 from the output signal 36 from the ILO. The distorter output signal has a difference tone in a predetermined frequency band if the output signal from the ILO is not synchronized with an injection signal of the ILO. The distorter output signal does not have a difference tone in the predetermined frequency band if the output signal from the ILO is synchronized with the injection signal of the ILO. It can therefore be determined whether or not the ILO is synchronized with the injection signal by capturing whether or not the difference tone is present in the distorter output signal. For this purpose, the level detector 34 detects the level of the difference tone in the predetermined frequency band. In examples, the apparatus determines whether or not the difference tone is present on the basis of the detected level.

Since the natural oscillation frequency of the ILO is outside the synchronization bandwidth with respect to the frequency of the injection signal in the non-synchronized state, the spacing between the frequencies of the two signals will be expected to be greater than the synchronization bandwidth. The difference tone occurs at a frequency which corresponds to this spacing. The difference tone will therefore be expected to occur in an expected predetermined frequency band which is greater than the synchronization bandwidth and may extend to twice the synchronization bandwidth, for example.

In examples, the apparatus has a comparator in order to compare the level of the difference tone with a threshold value, wherein the apparatus determines that the ILO is synchronized with the injection signal if the level of the difference tone is less than the threshold value, and determines that the injection locked oscillator is not synchronized with the injection signal if the level of the difference tone is greater than the threshold value. Such a comparator 40 is illustrated using dashed lines in FIG. 1.

Examples of the present disclosure provide a system having the apparatus 30 and an ILO 14, wherein the output signal 36 from the ILO 14 is applied to an input of the apparatus 30. In examples of the present disclosure, the ILO 14 is a frequency-multiplying ILO, wherein the frequency of the output signal from the ILO corresponds to n times the frequency of the injection signal, where n is a natural number of greater than or equal to 1.

In examples, the apparatus 30 can be implemented using any desired suitable circuit structures, for example integrated circuit structures, ASIC circuit structures, CMOS circuit structures, microprocessor circuit structures and the like. In examples, the apparatus is integrated on a chip. In examples, the distorter can be implemented using a non-linear element which is able to generate a difference tone from two corresponding tones, for example an overdriven transistor with a broadband load or a diode. In examples, the distorter is designed to generate IM2 distortion products at its output.

One implementation example of a corresponding apparatus is described below with reference to FIG. 3.

FIG. 3 shows an oscillator stage 50 which has a signal source, for example a VCO 10, and an ILO 14. An output of the VCO 10 is coupled to an injection input of the ILO 14 and supplies an injection signal having a frequency $f_A$ to an injection input of the ILO 14. In this example, the ILO 14 is not a frequency-multiplying ILO. The VCO 10 may be, for example, a local oscillator and the frequency $f_A$ may correspond to a local oscillator frequency. The ILO has a synchronization bandwidth $f_{upper} - f_{lower}$, where $f_{upper}$ and $f_{lower}$ are an upper frequency limit and a lower frequency limit, to which the ILO can synchronize with an injection signal. A free-running natural oscillation frequency of the ILO 14 is $f_B$. An output of the oscillator stage 50 is connected to an input of the apparatus 30. The output signal 36 from the ILO 14, which is a useful signal at a predetermined frequency for downstream circuit structures (not shown), is present at the output of the oscillator stage 50.

The output of the oscillator stage 50 is connected to the input of a distorter stage 52. The distorter stage 52 may be implemented using a distorter, as described above. The output of the distorter stage 52 is connected to an input of a first level detector 54. The output of the first level detector 54 is connected to the input of a second level detector 58 via a circuit 56 which is a bandpass filter. The output of the second level detector 58 is connected to an input of a comparator 62 via a low-pass filter 60.

In the example shown, the circuit 56 has a low-pass filter having a series resistor 70 and a parallel capacitor 72. In the example shown, the circuit 56 also has a DC signal blocker 74 which may be formed by a capacitor. In the example shown, the low-pass filter 60 has a series resistor 76 and a parallel capacitor 78. Series means that the respective element is connected into the signal path, whereas parallel means that the respective element is connected between the signal path and a reference potential, for example ground.

As shown in FIG. 4A, in the non-synchronized state, the output signal 36 from the oscillator stage 50 has two tones at the frequencies $f_A$ and $f_B$ which are denoted using A and B. In this case, the frequency $f_A$ corresponds to the frequency of the injection signal in the case of a non-multiplying ILO and corresponds to the frequency of the injection signal multiplied by the multiplier in the case of a multiplying ILO. As shown in FIG. 5A, the output signal 36 from the oscillator stage 50 has only one tone A at the frequency $f_A$ in the synchronized state.

The distorter stage 52 at the output of the oscillator stage 50 generates a difference tone C at the frequency $f_C = f_B - f_A$ in the non-synchronized state. The output signal from the distorter stage 52 also contains the tones A and B as well as further products, as shown in FIG. 4B. As shown in FIG. 5B, in the synchronized state of the ILO 14, the output signal from the distorter stage 52 contains only one tone A at the frequency $f_A$ and the integer multiples thereof which are, however, in a high frequency range irrelevant to the functional principle described herein.

The level detector 54 is implemented as a "fast" level detector which is configured to operate at a high frequency, with the result that it can follow the frequency of the difference tone C. The level detector 54 therefore outputs, at its output, a signal which, in the non-synchronized case, has a DC signal component DC, which is proportional to the sum of the levels of the other tones including the tones A and B, a tone C at the frequency $f_C = f_B - f_A$, the tones A and B, and second-order products ($2 \times f_A$, $2 \times f_B$, ...).

In the non-synchronized state, the signal which is shown in FIG. 4C is present at the output of the level detector 54 and has the DC signal component DC and the tone C at the frequency $f_C = f_B - f_A$. The other signal components at higher frequencies are attenuated on account of the behavior of the level detector 54. In the synchronized state, the signal shown in FIG. 5C is present at the output of the level detector 54 and has the DC signal component DC and an attenuated part of the tone A.

The low-pass filter at the output of the first level detector 54 is designed to eliminate higher-frequency components in the output signal from the first level detector 54. The low-pass filter may have, for example, a characteristic curve 80 as shown in FIG. 4C. The cut-off frequency $f_G$ of the low-pass filter can be above the expected frequency $f_C$. The expected frequency $f_C$ may be greater than the synchronization bandwidth of the ILO. In examples, the cut-off frequency $f_G$ may satisfy the condition $f_G >\sim 2 \times (f_{upper} - f_{lower})$.

In examples, the cut-off frequency $f_G$ of the low-pass filter may be in a range corresponding to twice the synchronization bandwidth of the injection locked oscillator ±20%.

If the first level detector 54 exhibits such a low-pass behavior that higher-frequency signal components are adequately attenuated considerably below the frequencies $f_A$ and $f_B$, the downstream low-pass filter is not required. Furthermore, the low-pass filter may be integrated in the first level detector 54.

The downstream DC signal blocker 74 blocks the DC signal component DC at the output of the low-pass filter 70, 72 that is generated by the first level detector 54. The second level detector 58 is implemented as a "slow" level detector which, in the non-synchronized state, outputs a DC signal level corresponding to the level of the tone C, as shown in FIG. 4D. In the synchronized state, the tone C is not present, and so the second level detector does not output a DC signal level corresponding to the level of the tone C.

The level detector 58 therefore captures the level of the difference tone at the frequency $f_C = f_B - f_A$. Depending on the level of the difference tone, it can be determined whether the ILO 14 is in the synchronized or non-synchronized state. For this purpose, the DC signal level can be compared with a threshold value 82 in the comparator 62. If the level of the difference tone is greater than or equal to the threshold value, the ILO 14 is in the non-synchronized state, and, if the level of the difference tone is less than the threshold value, the ILO 14 is in the synchronized state. The comparator can output a state signal 64 which indicates whether the ILO 14 is in the synchronized state or in the non-synchronized state.

In examples of the present disclosure, the comparator 62 can be implemented as an analog comparator. In examples, the comparator 62 may have an analog/digital converter and may be implemented as a digital comparator.

In examples, the low-pass filter 60 may be connected between the second level detector 58 and the comparator 62, which low-pass filter has a low cut-off frequency in order to ensure that only the DC signal level based on the difference tone C is supplied to the comparator. In examples, the cut-off frequency of the low-pass filter is $\ll f_C$.

As shown using dashed lines in FIG. 3, in examples of the present disclosure, the apparatus can have a DC signal level detector 90 in order to detect the DC signal level at the output of the first level detector 54. The apparatus can then use the detected DC signal level to assess whether there is a signal at the input of the distorter. The DC signal level detector 90 therefore makes it possible to verify the determination of whether the ILO 14 is in a synchronized state. If the level of the difference tone C is below the threshold value and the DC signal level, which is captured by the DC signal level detector 90, is likewise below an associated further threshold value, it can be determined that the determination with respect to the synchronized state of the ILO is not reliable since a suitable signal, which causes a corresponding DC signal level at the output of the first level detector 54, is not present at the input of the distorter.

In example implementations, a broadband amplifier can be connected upstream of the second level detector, in particular if the response threshold of the second level detector is relatively high.

In summary, the functionality of examples of a detector chain, as shown in FIG. 3, is described again.

Non-synchronized state: two tones A and B appear at the output of the non-synchronized (out-of-lock) ILO 14, FIG. 4A. A difference tone is generated in the distorter stage 52 as an IM2 product at the frequency $f_C = f_B - f_A$, together with IM3 tones and the original tones, in which case products in a higher frequency range are ignored here. The first level detector 54 uses its low-pass filter, the cut-off frequency of which may be above and in the vicinity of the expected frequency $f_C$, to generate a DC signal, which is composed of the amplitudes of $f_A$, $f_B$, $f_C$, plus a strong tone at $f_C$ and greatly attenuated tones at $f_A$ and $f_B$. The DC signal blocker 74 between the output of the first level detector and the input of the second level detector 58 eliminates the DC signal component which comes from the first level detector 54 and mainly represents the strong tones A and B. The second level detector 58 then ideally captures only the level of the difference tone C and generates a proportional output voltage. This output voltage can be compared with a threshold level and can be converted into a synchronization capture signal 84 which indicates the non-synchronized state. This signal 84 can be made available to other components (not shown) in the system and can be used to retune the ILO in response thereto in order to arrive at a synchronized state.

Synchronized state: in the synchronized state, only one tone A at the frequency $f_A$ appears at the output of the ILO 14. The distorter cannot use this single tone A at its input to generate a low-frequency difference tone. The first level detector 54 generates a DC signal level DC which is proportional to the amplitude of the tone A. Scatter products and harmonics may exist but are sufficiently well filtered by the low-pass filter in order to fall below the threshold of the second level detector. The DC signal blocker 74 between the two level detectors 54 and 58 in turn eliminates the DC signal level which comes from the first level detector 54. The second level detector 58 will not generate a signal since RF scatter products and harmonics which are caused by the first level detector are much too low or are sufficiently attenuated by the low-pass filter to be rectified. Since no DC output voltage is generated in the second level detector in this case, the capture circuit in the form of the comparator 62 will generate the synchronization capture signal 84 which indicates that the ILO is synchronized. This signal can in turn be supplied to other components (not shown) of the system.

Examples of the present disclosure provide an apparatus for determining whether an ILO is in a synchronized state, which apparatus has a distorter, two level detectors and a comparator. A low-pass filter and a DC signal blocker, which together constitute a bandpass filter, can be connected between the first level detector and the second level detector. The first level detector may be implemented as a fast level detector which can follow the frequency of a difference tone in the output signal from the distorter and therefore outputs the level of the difference tone as a tone at the frequency of the difference tone. The second level detector may be implemented as a slow level detector which rectifies the level of the difference tone and outputs it as a DC signal level. Examples of the present disclosure therefore provide difference tone generation and double level capture in the difference tone frequency band in order to determine whether the ILO is synchronized.

In examples in which the distorter and/or a further level detector generate(s) a DC signal component, the apparatus can have the DC signal blocker which is connected upstream of the level detector. This makes it possible to prevent the level detector from generating a DC signal level when the difference tone is not present. In examples, a low-pass filter is connected between the distorter and the level detector, wherein a passband of the low-pass filter has the predetermined frequency band, and wherein the low-pass filter is designed to attenuate frequencies which correspond to a frequency of the injection signal or to the frequency of the injection signal multiplied by a multiplier of the ILO and a free-running resonant frequency of the injection locked oscillator. In examples, the cut-off frequency of the low-pass filter is greater than a synchronization bandwidth of the injection locked oscillator. In examples, the cut-off frequency of the low-pass filter is in a range corresponding to twice the synchronization bandwidth of the injection locked oscillator plus or minus a tolerance range of 20%. In examples, the apparatus has a bandpass filter having the low-pass filter and a DC signal blocker.

In examples, the distorter may be formed by a further level detector or may have a further level detector. The further level detector may be the first level detector 54 shown in FIG. 1. If the latter is designed to provide sufficient distortion, it is possible to dispense with the additional distorter stage 52. In examples, the distorter may have a non-linear element, the output of which is coupled to the further level detector. An intermediate signal at the output of the further level detector may have a DC signal level which depends on the amplitudes of all tones in the input signal of the further level detector. In examples, the DC signal level may be proportional to the sum of the amplitudes of all tones in the input signal of the further level detector. In examples, the apparatus may have a DC signal level detector in order to detect the DC signal level, wherein the apparatus is designed to assess whether there is a signal at the input of the distorter on the basis of the detected DC signal level. In examples, it is therefore possible to use a first level detector to check whether there are actually signals at the apparatus by checking whether there is a DC signal level upstream of the DC signal blocker. If a DC signal level is not present there, it can be understood therefrom that there are no signals or incorrect signals at the input of the distorter. A rectifying level detector and/or an analog/digital converter can be used as the DC signal level detector and can also be used to infer the output power.

In examples in which the first level detector is not provided and the distorter does not generate a DC signal component, it is also possible to dispense with the DC signal blocker.

The determination of whether or not the ILO is synchronized with the injection signal is based on the output signal from the ILO. In examples, the output signal from the ILO is used. In examples, it may be sufficient to branch off a part of the output signal, for example a very small part which is negligible for the useful signal of the ILO, and to use this branched-off part for the determination described herein.

In examples of the present disclosure, the output signal or at least part of the output signal from an ILO is therefore supplied to a distorter, at the output of which a difference tone is present if the output signal from the ILO has tones at two different frequencies. The output signal from the distorter is filtered in order to block signal components outside an expected frequency band. The signal filtered in this manner is supplied to a level detector which is designed to capture the level of the difference tone, wherein it is determined whether or not the ILO is in the synchronized, locked state using the captured level.

Figure 7:
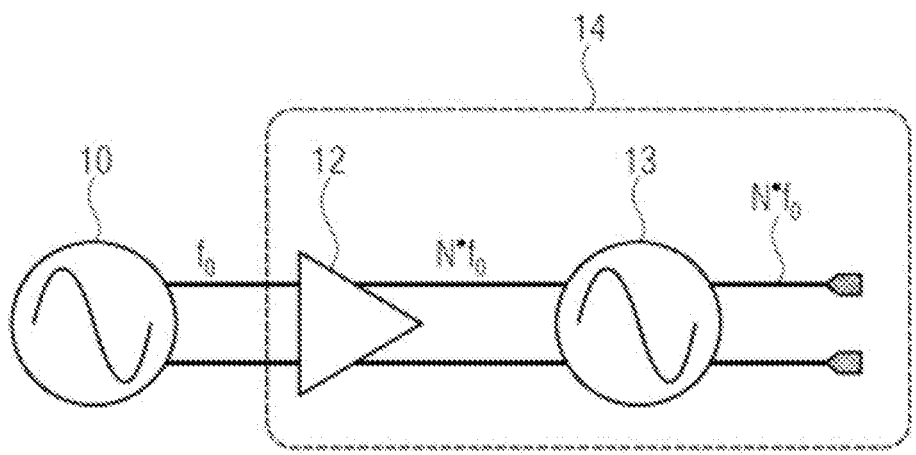
FIG. 7 schematically shows an example of a frequency-multiplying ILO.

FIG. 7 shows a flowchart of an example of a method for determining whether an output signal from an injection locked oscillator is synchronized with an injection signal coming from an input oscillator. At 100, the output signal from the injection locked oscillator is distorted in order to generate a distorted signal which has a difference tone in a predetermined frequency band if the output signal from the injection locked oscillator is not synchronized with the injection signal. At 102, the level of the difference tone is detected. At 104, it is determined whether the output signal from the injection locked oscillator is synchronized with the injection signal on the basis of the level of the difference tone.

Examples of the present disclosure are suitable for radio-frequency output signals from ILOs, for example in a range of 10-100 GHz. The higher the frequency, the higher the synchronization bandwidth, that is to say the so-called locking range, of such oscillations, which may be 0.5 to 1 GHz. In examples, the frequency spacing between the two tones in the non-synchronized state may therefore be greater than 0.5 GHz or 1 GHz and may even be greater than 3 or 5 GHz, for example, in frequency-multiplying ILOs. In examples, a frequency of an injection signal may be 16 GHz and an output frequency of the ILO with a multiplier of five may be 80 GHz. In such frequency ranges, it is difficult to analyze the output signal using a fast Fourier transform (FFT). Examples of the present implementation make it possible to easily determine whether one or two spectral lines are present in the output signal from the ILO. At lower frequencies of up to 500 MHz, for example, it would be theoretically possible to use an on-chip FFT, but examples of the present disclosure are faster and consume less current in comparison with this.

Although some aspects of the present disclosure have been described as features in connection with an apparatus, it is clear that such a description can likewise be considered to be a description of corresponding method features. Although some aspects have been described as features in connection with a method, it is clear that such a description can also be considered to be a description of corresponding features of an apparatus or of the functionality of an apparatus.

The disclosure above provides illustrations and descriptions, but the intention is not for the disclosure to be exhaustive or for the implementations to be restricted to the precise form disclosed. Modifications and variations are possible with regard to the above disclosure or can be obtained from the practice of the implementations. Although particular combinations of features have been cited in the patent claims and/or disclosed in the description, there is no intention for these features to restrict the disclosure of possible implementations. Numerous ones of these features can actually be combined in ways which are not specifically cited in the patent claims and/or disclosed in the description. Although each of the dependent patent claims cited below possibly directly depends only on one or a few patent claims, the disclosure of possible implementations comprises any dependent patent claim in combination with all other patent claims in the set of patent claims.

The examples described above are only representative of the principles of the present disclosure. It should be understood that modifications and variations of the arrangements and of the details described are obvious to experts. The intention is therefore for the disclosure to be limited only by the accompanying patent claims and not by the specific details stated for the purpose of describing and explaining the examples.

LIST OF REFERENCE SIGNS

10 VCO
12 Harmonic generator
14 ILO
20, 22 Spectral lines
30 Determination apparatus
32 Distorter
34 Level detector
36 ILO output signal
38 Distorter output signal
40 Comparator
50 Oscillator stage
52 Distorter
54 First level detector
56 Bandpass filter
58 Second level detector
60 Low-pass filter
62 Comparator
70 Resistor
72 Capacitor
74 DC signal blocker
76 Resistor
78 Capacitor
80 Low-pass filter characteristic curve
82 Threshold value
84 State signal
90 DC signal level detector

The invention claimed is:

1. An apparatus comprising:
a distorter configured to use an output signal from an injection locked oscillator to generate a distorter output signal,
wherein the distorter output signal comprises a difference tone in a predetermined frequency band if the output signal from the injection locked oscillator is not synchronized with an injection signal from an input oscillator;
a level detector configured to detect a level of the difference tone,
wherein the apparatus is configured to determine, based on the level of the difference tone, whether the output signal from the injection locked oscillator is synchronized with the injection signal; and
a direct current (DC) signal blocker downstream of the level detector.

2. The apparatus as claimed in claim 1, further comprising:
a comparator configured to compare the level of the difference tone with a threshold value, and
wherein the apparatus, when determining whether the output signal from the injection locked oscillator is synchronized with the injection signal, is configured to:
determine that the output signal from the injection locked oscillator is synchronized with the injection signal if the level of the difference tone is less than the threshold value, and
determine that the output signal from the injection locked oscillator is not synchronized with the injection signal if the level of the difference tone is greater than or equal to the threshold value.

3. The apparatus as claimed in claim 2, further comprising: a low-pass filter connected between the level detector and the comparator.

4. The apparatus as claimed in claim 1, further comprising: a low-pass filter,
wherein a passband of the low-pass filter has the predetermined frequency band, and
wherein the low-pass filter is configured to attenuate frequencies corresponding to a frequency of the injection signal or to a frequency of the injection signal multiplied by a multiplier of the injection locked oscillator and a free-running resonant frequency of the injection locked oscillator.

5. The apparatus as claimed in claim 4, wherein a cut-off frequency of the low-pass filter is greater than a synchronization bandwidth of the injection locked oscillator.

6. The apparatus as claimed in claim 5, wherein the cut-off frequency of the low-pass filter is in a range which corresponds to twice the synchronization bandwidth of the injection locked oscillator ±20%.

7. The apparatus as claimed in claim 4, further comprising:
a bandpass filter having at least one of the low-pass filter or the DC signal blocker.

8. The apparatus as claimed in claim 1, wherein the DC signal blocker is formed by a capacitor.

9. The apparatus as claimed in claim 1, further comprising:
another level detector, and
wherein an intermediate signal at an output of the level detector has a DC signal level which depends on amplitudes of all tones in the output signal from the injection locked oscillator.

10. The apparatus as claimed in claim 1, wherein the distorter has a non-linear element,
wherein an output of the non-linear element is coupled to the level detector, and
wherein the level detector is configured to generate an intermediate signal having a DC signal level which depends on amplitudes of all tones in the distorter output signal.

11. The apparatus as claimed in claim 9, further comprising:
a DC signal level detector configured to detect the DC signal level, and
wherein the apparatus is configured to assess whether a signal is present at an input of the distorter based on the DC signal level.

12. A system having the apparatus as claimed in claim 1 and the injection locked oscillator.

13. The system as claimed in claim 12, wherein the injection locked oscillator is a multiplying injection locked oscillator, and
wherein a frequency of the output signal from the injection locked oscillator corresponds to n times or (2n−1) times a frequency of the injection signal,
wherein n is a natural number of greater than 1.

14. A method comprising:
distorting an output signal from an injection locked oscillator to generate a distorted signal which has a difference tone in a predetermined frequency band if the output signal from the injection locked oscillator is not synchronized with an injection signal from an input oscillator;
detecting a level of the difference tone;
blocking a direct current (DC) signal level of the distorted signal after detecting the level of the difference tone; and
determining whether the output signal from the injection locked oscillator is synchronized with the injection signal based on the level of the difference tone.

15. The method as claimed in claim 14, further comprising:
comparing the level of the difference tone with a threshold value; and
wherein determining whether the output signal from the injection locked oscillator is synchronized with the injection signal comprises:
determining that the output signal of the injection locked oscillator is synchronized with the injection signal if the level of the difference tone is less than the threshold value, or
determining that the output signal of the injection locked oscillator is not synchronized with the injection signal if the level of the difference tone is greater than or equal to the threshold value.

16. The method as claimed in claim 14, further comprising:
detecting the DC signal level of the distorted signal before blocking the DC signal level; and
determining, based on the detecting the DC signal level, whether a signal is present at an input of a distorter which generates the distorted signal.

17. The method as claimed in claim 14, further comprising:
filtering, using a low-pass filter, the distorted signal,
wherein a passband of the low-pass filter has the predetermined frequency band, and
wherein frequencies corresponding to a frequency of the injection signal or to a frequency of the injection signal multiplied by a multiplier of the injection locked oscillator and a free-running resonant frequency of the injection locked oscillator are attenuated.

18. The method as claimed in claim 17, wherein a cut-frequency of the low-pass filter is greater than a synchronization bandwidth of the injection locked oscillator and is in a range which corresponds to twice the synchronization bandwidth of the injection locked oscillator ±20%.

19. The apparatus as claimed in claim 1, further comprising:
another level detector downstream of the DC signal blocker.

20. An apparatus comprising:
a distorter comprising a single input and configured to:
receive, via the single input, an output signal from an injection locked oscillator, and
use the output signal from the injection locked oscillator to generate a distorter output signal,
wherein the distorter output signal comprises a difference tone in a predetermined frequency band if the output signal from the injection locked oscillator is not synchronized with an injection signal from an input oscillator; and
a level detector configured to detect a level of the difference tone,
wherein the apparatus is configured to determine, based on the level of the difference tone, whether the output signal from the injection locked oscillator is synchronized with the injection signal.

* * * * *